United States Patent [19]
Tokunaga et al.

[11] Patent Number: 5,905,558
[45] Date of Patent: May 18, 1999

[54] CIRCUIT PLATE, PROCESS FOR PRODUCING SAME AND LIQUID CRYSTAL DEVICE INCLUDING SAME

[75] Inventors: Hiroyuki Tokunaga, Fujisawa; Masaru Kamio, Sagamihara; Haruo Tomono, Machida; Yuji Matsuo, Kawasaki, all of Japan

[73] Assignee: Canon Kabushiki Kaisha, Tokyo, Japan

[21] Appl. No.: 08/704,140

[22] Filed: Aug. 28, 1996

[30] Foreign Application Priority Data

Aug. 29, 1995 [JP] Japan ................................ 7-220871
Aug. 29, 1995 [JP] Japan ................................ 7-220872

[51] Int. Cl.$^6$ ................ G02F 1/1333; G02F 1/1343; G02F 1/1345; G02F 1/1339; G02F 1/1341
[52] U.S. Cl. ................ 349/149; 349/152; 349/155; 349/189; 349/190; 349/138; 349/143; 349/147
[58] Field of Search ................ 349/149, 152, 349/155, 189, 190, 138, 143, 147

[56] References Cited

U.S. PATENT DOCUMENTS

| | | | |
|---|---|---|---|
| 4,712,874 | 12/1987 | Sekimura et al. | 350/339 F |
| 4,714,636 | 12/1987 | Yokono et al. | 428/1 |
| 4,744,637 | 5/1988 | Sekimura et al. | 350/339 R |
| 4,818,075 | 4/1989 | Takao et al. | 350/339 F |
| 4,917,471 | 4/1990 | Takao et al. | 350/339 F |
| 5,078,475 | 1/1992 | Sekimura et al. | 359/68 |

*Primary Examiner*—William L. Sikes
*Assistant Examiner*—Julie Ngo
*Attorney, Agent, or Firm*—Fitzpatrick, Cella, Harper & Scinto

[57] ABSTRACT

A circuit plate, suitable for constituting an optical modulation device, such as a liquid crystal device, includes a light-transmissive substrate, and a plurality of principal electrodes and sub-electrodes supported on the light-transmissive substrate. Each sub-electrode is disposed between an associated principal electrode and the light-transmissive substrate so as to be electrically connected with the associated principal electrode. The plurality of sub-electrodes are disposed in a region in the light-transmissive substrate with gaps therebetween which are filled with an insulating layer, the sub-electrodes and the insulating layer in combination forming a surface on which the principal electrodes are formed. Further, a plurality of projection pieces are disposed in a region on the light-transmissive substrate outside the region of the sub-electrodes so as to be free from connection with the principal electrodes and the sub-electrodes. A liquid crystal device may be formed by disposing a liquid crystal between a pair of the circuit plates. The circuit plate is provided with an improved planarity over the entire effective optical modulation region and an improved connectability with peripheral ICs.

32 Claims, 15 Drawing Sheets

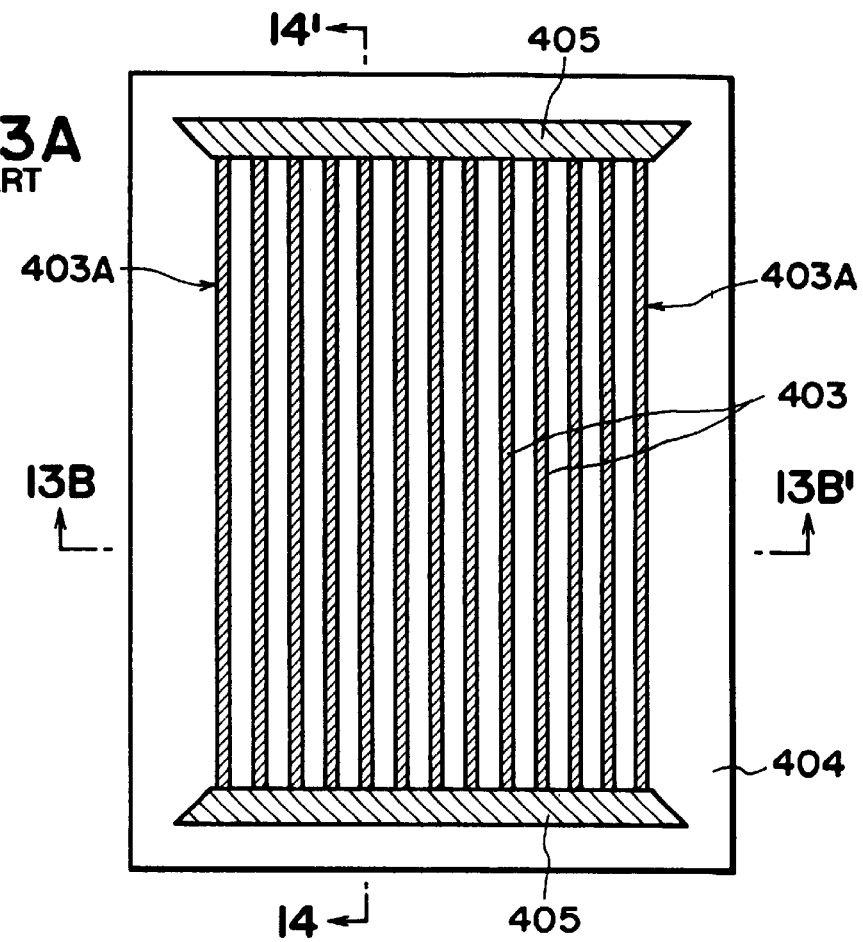
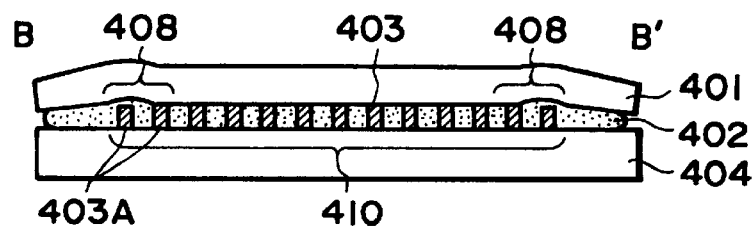
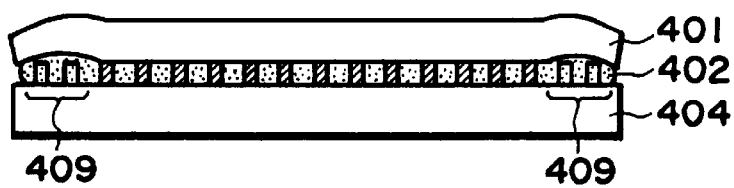

5,905,558

CIRCUIT PLATE, PROCESS FOR PRODUCING SAME AND LIQUID CRYSTAL DEVICE INCLUDING SAME

FIELD OF THE INVENTION AND RELATED ART

The present invention relates to a circuit plate used in various optical modulation devices, light-emission device, etc., a process for producing the circuit plate, a liquid crystal device including the circuit plate, and a process for producing the liquid crystal device. More particularly, the circuit plate may be used for terminal displays for computers, various flat panel displays for word processors, typewriters and television receivers, view finders for video cameras, light valves for projectors, light valves for liquid crystal printers, etc. More specifically, the circuit plate may suitably be used in an optical modulation device including a matrix of scanning electrodes and data electrodes so as to form an effective optical modulation area for image display, etc.

Electrode plates conventionally used in liquid crystal devices comprise a glass substrate and transparent electrodes of ITO (indium tin oxide), etc., formed thereon. However, such transparent electrodes have a fairly high resistivity so that they have caused a problem of voltage waveform deformation due to electrical signal delay along with increases in size and resolution of the effective optical modulation area.

In order to solve the problem, it may be possible to increase the thickness of the transparent electrodes, but the formation of such thick transparent electrodes requires increased time and cost and results in a lower transparency of the electrodes.

In order to solve the above-mentioned problems, it has been practiced to form a metal electrode along a transparent electrode of a small thickness (as disclosed in Japanese Laid-Open Patent Application (JP-A) 2-63019). According to the practice, a circuit plate having metal electrodes thereon embedded with a transparent insulating material so as to expose the metal pattern is provided, and transfer electrodes of ITO film, etc., are formed thereon.

In producing a circuit plate having a structure as described above, it has been also proposed to use a transparent resin as the insulating material filling the gaps between the metal electrodes (JP-A 6-347810) as illustrated in FIGS. 9 and 10.

According to the proposed process, as shown in FIG. 9A, on a smooth or smoothening mold substrate (hereinafter called "smooth plate") 201, a prescribed amount of a liquid resin (including a monomer, prepolymer or solution) of ultraviolet (UV)-curable resin, etc., is placed dropwise. Then, as shown in FIGS. 9B and 9C, a substrate (hereinafter called "electrode plate") 204 already provided with a pattern of metal electrodes 203 is placed thereon so that the surface thereof provided with the metal electrodes 203 contacts the liquid resin 202.

Further, as shown in FIG. 9D to FIG. 10A, the smooth plate 201 and the electrode plate 204 are pressed to each other to ensure an intimate contact over the entire area by pressing with a press 213. Thereafter, the electrode plate 204 in contact with the smooth plate 201 is irradiated with UV rays 206 to cure the UV-curable resin 202, and the smooth plate 21 is removed therefrom to obtain an electrode plate (hereinafter called a "circuit plate") 207 having thereon metal electrodes 203 and a cured resin 202a filling the gaps between the metal electrodes 203.

Thereafter, a transparent electrode layer (not shown) is formed over the cured resin 20a and the metal electrodes 3 so as to be electrically connected with the metal electrodes 3, followed by patterning thereof so as to be left along the metal electrodes 3, to provide a product circuit plate.

In the step of pressure-bonding the smooth plate 201 and the electrode plate 204 in the above-described process, there has been sometimes observed a difficulty that the resin 202 swells at a region (hereinafter called a "peripheral region") proximate to the periphery of the region provided with the metal electrodes 203.

The above phenomenon will be described with reference to FIGS. 11 and 12. When a smooth plate 301 and the electrode plate 304 are pressed to each other so as to sandwich a UV-curable resin 302, the UV-curable resin 302 is present up to a height higher than the metal electrodes 303 as shown in FIG. 11A.

If the laminate of the smooth plate 301 and the electrode plate 304 are supplied with a pressure from the above and below as shown in FIG. 11B, the thickness of the resin 302 is substantially equalized to the height of the metal electrodes 303 in an area where the metal electrodes 303 are present over a wide area but, in a peripheral region where the metal electrodes 303 are absent, the smooth plate 301 or the electrode plate 304 are warped and on the contrary some resin portion 308 can remain in a thickness larger than the height of the metal electrodes 303 in some cases.

When a circuit plate prepared in the above-described manner (after being provided with transparent electrodes) and accompanied with an irregular resin portion 308 is used to form a liquid crystal device, there occurs a cell gap irregularity in an effective optical modulation region (display region in the case of a display device), thus failing to effect a uniform optical modulation (display).

Further, as some portion 308 of the cured resin becomes higher than the metal electrodes, an insufficient electrical connection can occur between later formed transparent electrodes and the metal electrodes, to cause an electrical delay resulting in a voltage waveform distortion.

Further, in a region along a side perpendicular to the extension of the metal electrodes, the metal electrodes 303 are remarkably thickened (i.e., enlarged in width) to provide lead or takeout electrodes 305 as shown in FIG. 12B (partial plan view), so that the UV-curable resin caused to flow under pressing can lose its escape space to swell over the metal electrodes and form an irregularly thickened portion 308 as shown in FIG. 12A (sectional view). When such a circuit plate is used to form a liquid crystal device, a cell gap irregularity is also formed in an effective optical modulation region, thus failing to effect a uniform optical modulation.

Further, in such a case, the lead (or takeout) electrodes 305 for connection with external circuits and mask alignment marks disposed in such a peripheral region can be covered with the cured resin, thus being liable to cause electrical connection failure or obstruct an accurate alignment.

SUMMARY OF THE INVENTION

In view of the above-mentioned problems, a principal object of the present invention is to provide a circuit plate on which an irregular swelling of a resin in an effective optical modulation region is suppressed, and a liquid crystal device including such a circuit plate.

Another object of the present invention is to provide a circuit plate ensuring electrical connection at the lead electrodes and allowing an accurate alignment, and a liquid crystal device including such a circuit plate.

A further object of the present invention is to provide processes for producing a circuit plate and a liquid crystal device as described above.

According to the present invention, there is provided a circuit plate, comprising: a light-transmissive substrate, and a plurality of principal electrodes and sub-electrodes supported on the light-transmissive substrate; wherein each sub-electrode is disposed between an associated principal electrode and the light-transmissive substrate so as to be electrically connected with at least a part of the associated principal electrode, said plurality of sub-electrodes are disposed in a region on the light-transmissive substrate with gaps therebetween which are filled with an insulating layer, the sub-electrodes and the insulating layer in combination forming a surface on which the principal electrodes are formed, and a plurality of projection pieces are disposed in a region on the light-transmissive substrate outside the region of the sub-electrodes so as to be free from connection with the principal electrodes and the sub-electrodes.

According to another aspect of the present invention, there is provided a liquid crystal device: comprising a pair of circuit plates, and a liquid crystal disposed between the circuit plates, wherein at least one of the circuit plate is identical to the one described above.

According to a further aspect of the present invention, there is provided a process for producing a circuit plate comprising a light-transmissive substrate, and a plurality of principal electrodes and sub-electrodes supported on the light-transmissive substrate, each sub-electrode being disposed between an associated principal electrode and the light-transmissive substrate so as to be electrically connected with at least apart of the associated principal electrode; said process comprising the steps of:

forming a plurality of sub-electrodes with gaps therebetween on a region of a light-transmissive substrate, forming a plurality of projection pieces in a region outside the region of the sub-electrodes on the light-transmissive substrate so as not to be electrically connected with the sub-electrodes, forming an insulating layer so as to fill the gaps between the sub-electrodes and form a surface together the sub-electrodes, and forming principal electrodes on said surface so that each principal electrode is electrically connected with an associated sub-electrode.

According to another aspect of the present invention, there is provided a process for producing a circuit plate, comprising the steps of:

forming a plurality of sub-electrodes with gaps therebetween on a region of the light-transmissive substrate, filling the gaps with an ultraviolet-curable resin, smoothening the ultraviolet-curable resin by pressing, irradiating the ultraviolet-curable resin selectively in the region of the sub-electrodes to cure the ultraviolet-curable resin to leave the ultraviolet-curable resin outside the region uncured, and removing by washing the uncured ultraviolet-curable resin from the region outside the region of the sub-electrodes.

According to still another aspect of the present invention, there is provided a process for producing a liquid crystal device, comprising the steps of:

producing a pair of circuit plates according to any one of the above-described processes, disposing the pair of circuit plates opposite to each other with a gap left between, and filling the gap with a liquid crystal.

These and other objects, features and advantages of the present invention will become more apparent upon a consideration of the following description of the preferred embodiments of the present invention taken in conjunction with the accompanying drawings, wherein like parts are denoted by like reference numerals represented by equality of last two digits.

BRIEF DESCRIPTION OF THE DRAWINGS

FIGS. 13A–13D are a plan view and three sectional views for illustrating a principle for solving the problem involved in the prior art process described with reference to FIGS. 11A and 11B, including FIG. 13A which is a schematic plan view of an electrode plate used in a prior art process; FIG. 13B, a schematic sectional view showing a 13B–13B' section thereof; and FIGS. 13C and 13D, which are schematic sectional views for illustrating the solution principle adopted in the process according to the present invention.

DESCRIPTION OF THE PREFERRED EMBODIMENTS

Figure 1A:
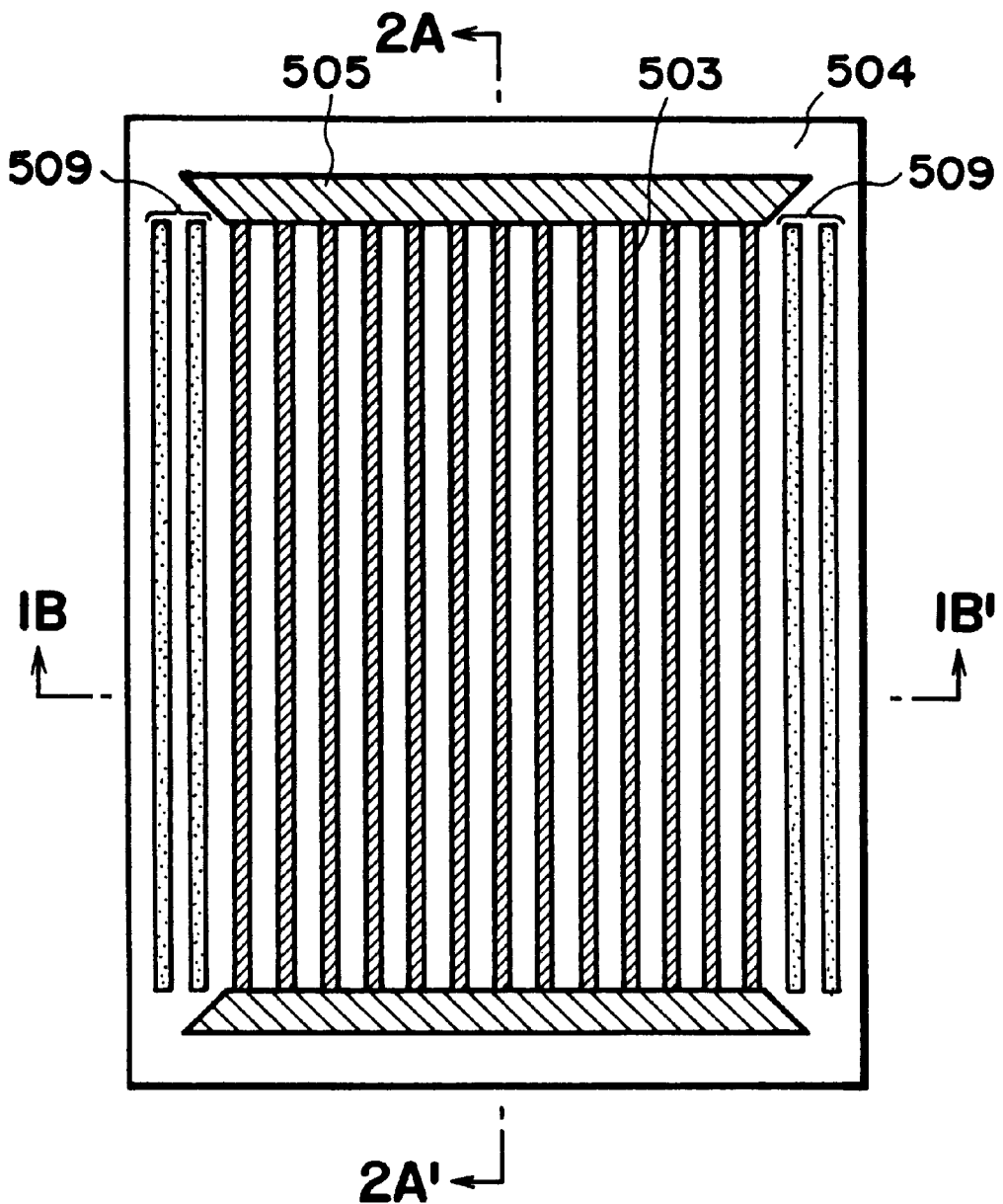
FIG. 1A is a schematic plan view showing an example of electrode plate used in a process for producing a circuit plate according to the present invention.

In the present invention, in a peripheral region (proximate to the periphery of the metal electrode-disposed region) on a light-transmissive substrate, dummy conductor pieces or projection pieces having a thickness close to that of the metal electrodes are disposed to receive a force exerted to the electrode plate and the smooth plate under pressing, so that the electrode plate and the smooth plate receive a uniform force even at the peripheral region. In other words, the swelling resin portion having occurred on the metal electrode portion in proximity to the peripheral region due to warping of the smooth plate and the electrode plate during the pressing force application in the prior art process is moved, if any, to or outside the peripheral region provided with the dummy conductor pieces or projection pieces outside the effective optical modulation region, thereby removing an adverse effect to the effective optical modulation region.

Further description will be made with reference to the drawings.

FIG. 13A is a schematic plan view of an electrode plate (used for providing a circuit plate used in a liquid crystal device). When such an electrode plate 404 having patterned metal electrodes 403 thereon is applied under pressure to a smooth plate 401 coated with a UV-curable resin 402 so as to smoothen a stepwise difference in height given by the metal electrodes 403, marginal side portions of the electrode plate 404 parallel to the metal electrodes 403 (particularly along the lateral edge electrodes 403A thereof) are warped to cause resin swelling portions 408 on the laterally edge electrodes 403A as shown in FIG. 13B which is a sectional view taken along a line 13B–13B' in FIG. 13A. The lateral edge electrodes 403A are within an effective optical modulation region 410 so that the resin swelling portions 408 causes a narrower liquid crystal cell gap within the effective optical modulation region, thus deteriorating the optical performance thereby and hindering the electrical communication between the edge metal electrodes 403A and transparent electrodes formed thereon as will be described later.

In contrast thereto, in the present invention, dummy conductor pieces 409 are disposed in a peripheral region outside the metal electrode-provided region so as to have a height similar to that of the metal electrodes 403, so that such a resin swelling portion 409, even if occurring, is shifted outside the effective optical modulation region to ensure a planarity of the electrode plate 404 (and the smooth plate 401) in the effective optical modulation region and also ensure the electrical connection of the edge metal electrodes 403A with the transparent electrodes formed thereon. In this instance, it is possible to mask the peripheral region outside the effective optical modulation region with a mask 411 during irradiation with UV rays 406 to selectively cure the UV-curable resin 402 in the effective optical modulation region to leave uncured the UV-curable resin 402 in the peripheral region, which is then removed by washing, thereby providing a circuit plate wherein the gaps between the metal electrodes 403 are filled with UV-cured resin 402A only in the effective optical modulation region.

Figure 14A:
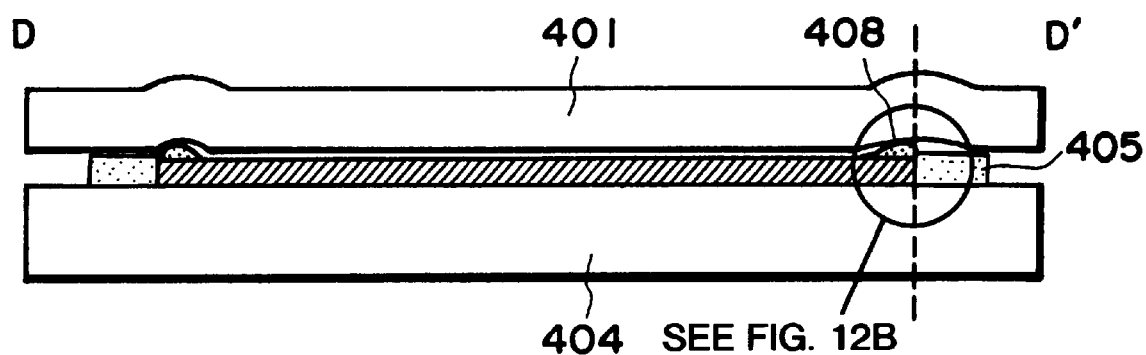
FIG. 14 is a schematic sectional view for illustrating a step for producing a circuit plate corresponding to a section taken along a line 14D–14D' in FIG. 13A.
Figure 14B:
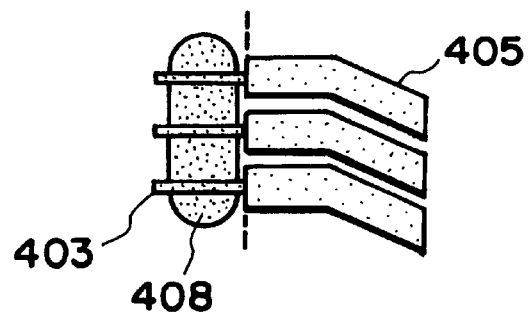
Figure 15A:
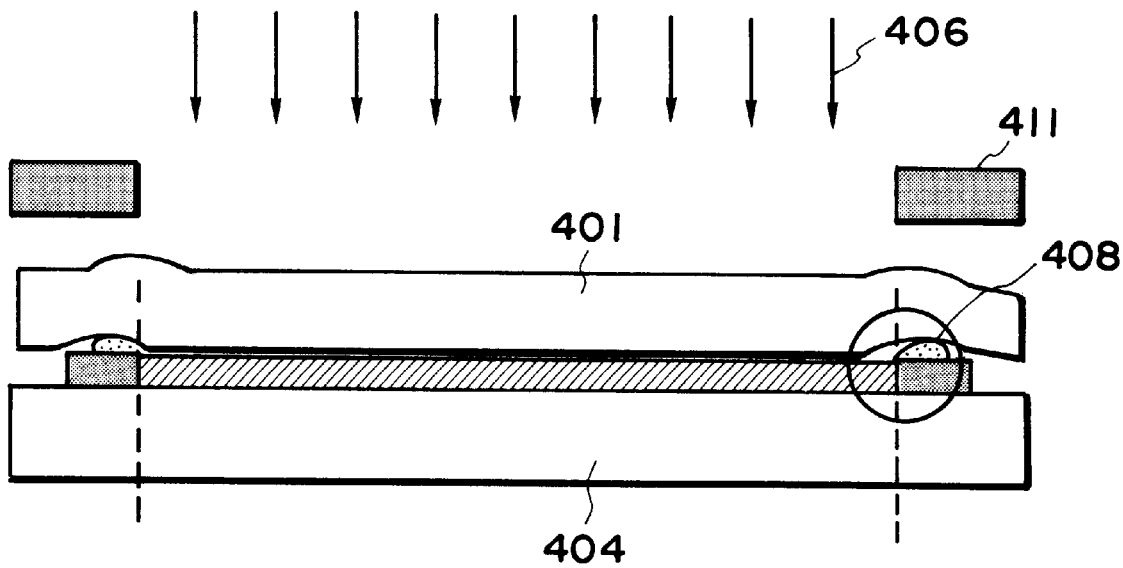
FIGS. 15A and 15B are a schematic sectional view and an enlarged partial plan view, respectively, for illustrating a principle for solving the problem of resin swelling in proximity of the lead electrodes.
Figure 15B:
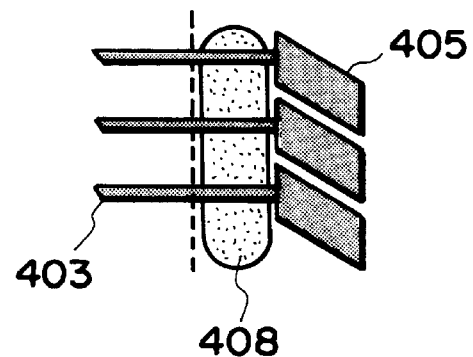

On the other hand, in a peripheral region extending perpendicularly to the metal electrodes 403, lead electrodes 405 having a substantially larger width than the metal electrodes 403 are disposed whereby the UV-curable resin caused to flow under pressing can lose an escape space to form a swelling 408 over the end portion of the metal electrodes 403 as shown in FIGS. 14A and 14B. For obviating this difficulty, it is preferred to narrow the portion of the lead electrodes 405 close to the effective optical modulation region like the metal electrodes 403 to shift the resin swelling portion 408 to outside the effective optical modulation region. Also in this instance, it is possible to mask the peripheral region with a mask 411 during the irradiation with UV rays 406, so as to remove uncured portion of the UV-curable resin from the peripheral region thereafter.

Hereinafter, some preferred embodiments of the circuit plate and the liquid crystal device will be described together with the production process thereof with reference to FIGS. 1 to 5.

Figure 1B:
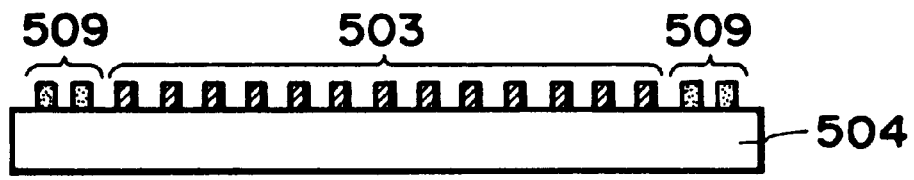
FIG. 1B is a schematic sectional view showing an 1B–1B' section thereof.
Figure 2A:
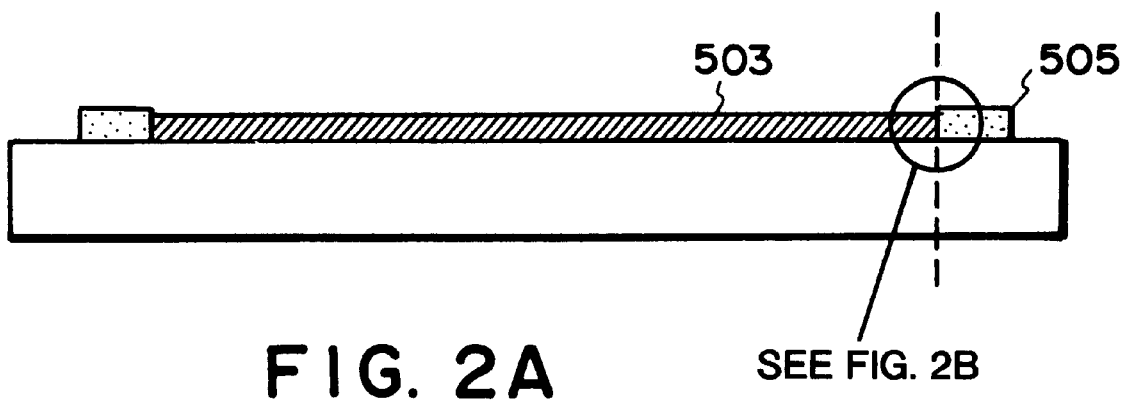
FIG. 2A is a schematic sectional view showing a 2A–2A' section of the electrode plate shown in FIG. 1A.
Figure 2B:
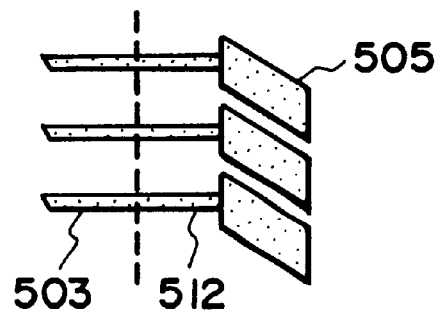
FIG. 2B is an enlarged partial plan view corresponding thereto.

First, as shown in FIG. 1A and FIG. 1B (which is a sectional view showing an A-A' section in FIG. 1A), a light-transmissive substrate (glass sheet) 504 is provided with stripe-shaped metal electrodes 503 in an effective optical modulation region and in peripheral regions outside thereof, with dummy conductor pieces 509 having a height (thickness) almost identical to that of the metal electrodes 503 extending substantially in parallel with the metal electrodes 503.

More specifically, it is preferred that the dummy conductor pieces 509 have a thickness which is 0.5 to 1.5 times, more preferably substantially equal to, that of the metal electrodes 503.

The dummy conductor pieces 509 may preferably be formed of a common material and in a common step as the metal electrodes 503 in view of a production cost thereof, but can also be formed of a different material other than metal, such as a photoresist, by a separate step from the production of the metal electrodes 503.

Figure 3:
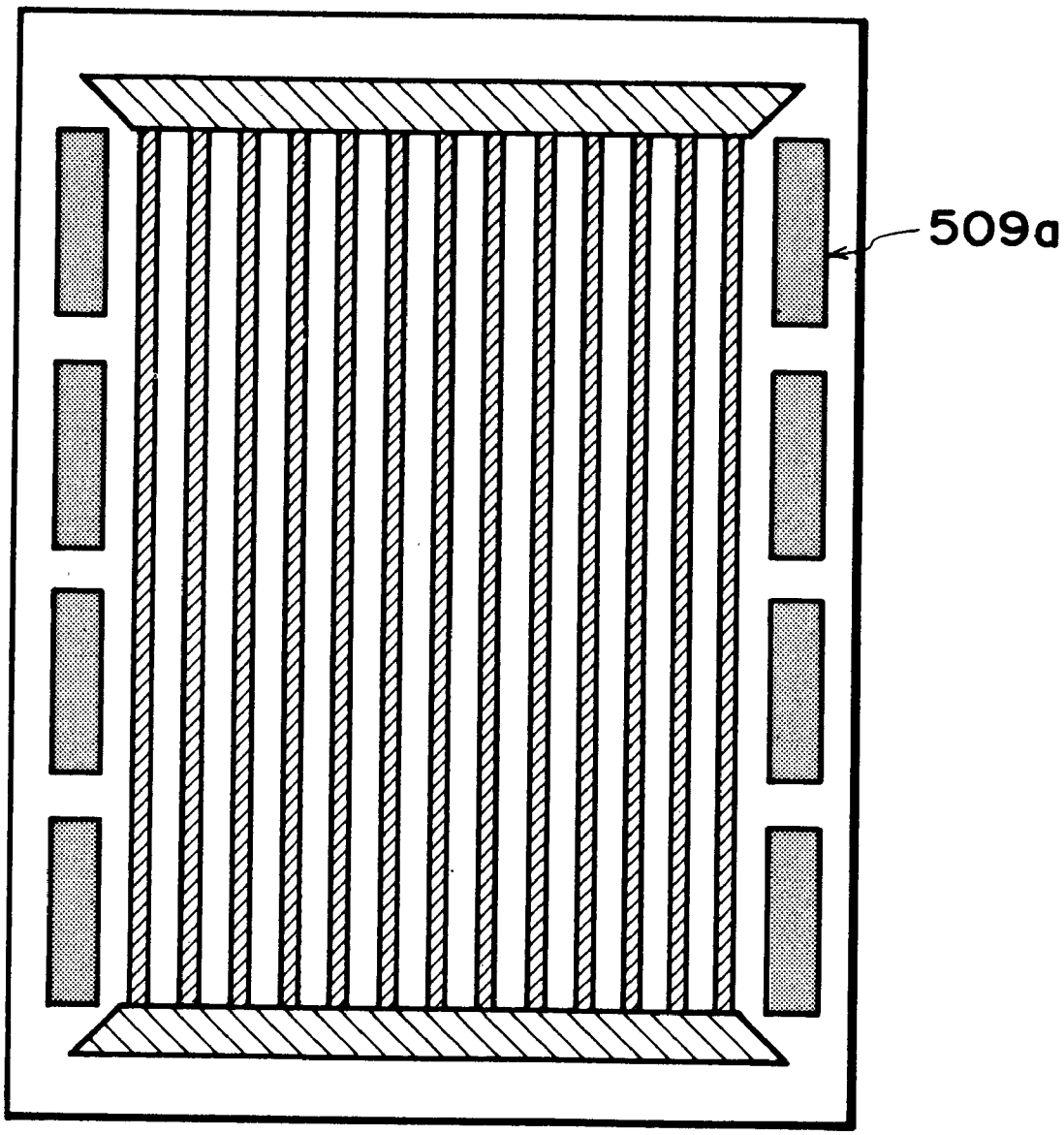
FIG. 3 is a schematic plan view of another example of electrode plate used in a process of the present invention.

The dummy conductor pieces 509 can be formed in discrete rectangular or island shape like pieces 509a shown in FIG. 3 but may preferably be stripe-shaped similarly a the metal electrodes 503 in view of the fluidity of a UV-curable resin therealong. It is preferred that the dummy conductor pieces 509 have a thickness identical to that of the metal electrodes 503, but a difference within an extent of not causing a strain of substrate thereby can be tolerated. More specifically, it is preferred that the dummy conductor pieces 509 have a thickness which is 0.5 to 1.5 times that of the metal electrodes 503.

The dummy conductor pieces 509 may be provided in a region having a width of ca. 1–20 mm, preferably 5–10 mm. The region can have a width in excess of 20 mm but the effect of smoothening the resin over the metal electrodes is not particularly improved thereby.

If the region has a width below 1 mm, the warp of the smooth plate or the electrode plate 501 caused during the smoothening of the resin under pressure application may not be sufficiently absorbed, thus being liable to leave a resin swelling in the effective optical modulation region.

On the other hand, in a peripheral region close to the lead electrodes 505, it is preferred that portions 512 of the lead electrodes 505 close to the metal electrodes 503 are made narrower similarly as the metal electrodes 503 (as if the metal electrodes 503 are extended) so as to provide an escape space for flowing resin. The narrower lead electrode portion 512 may have a length of ca. 1–20 μm, preferably 5–15 mm, optimally 7–12 mm. The length can exceed 20 mm but a particularly better effect of smoothening the resin above the metal electrodes 503 is not obtained thereby.

If the length is below 1 mm, the flowing resin may not be retained in the narrower lead electrode region to leave a resin swelling in the effective optical modulation region.

Figure 4A:
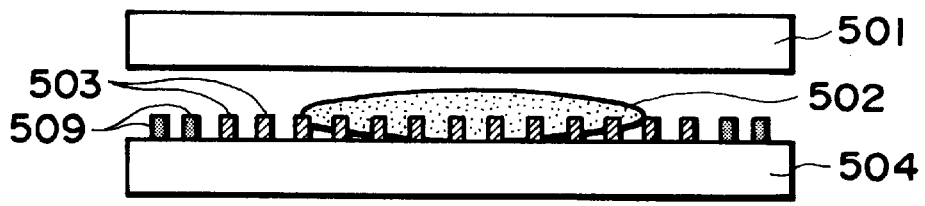
FIGS. 4A–4D are schematic sectional views for illustrating an embodiment of the process for producing a circuit plate according to the present invention.

The electrode plate having a structure as described above with reference to FIGS. 1–2 (and 3) may be coated with a silane coupling agent as a surface treatment for improving the adhesion of a resin onto the light-transmissive substrate (glass sheet) 504, and a filling resin 502 is placed on the electrode plate 504 (FIG. 4A) or a smooth plate 501. Then, the electrode plate 504 and the smooth plate 501 are disposed opposite to each other with the metal electrodes 503 and the resin 502 therebetween (FIG. 4A). The smooth (ening) plate 501 may comprise metal, glass, ceramic or synthetic resin, and the light-transmissive substrate 504 may comprise a transparent material, such as glass, ceramic or resin.

The filling (liquid) resin 502 may comprise various liquid resin (monomer or prepolymers), preferably UV-curable resins of, e.g., epoxy-type or acrylic type, in view of the later process. The filling resin 502 is illustrated to be placed on the electrode plate 504 (FIG. 4A) but can also be placed on the smooth plate 501.

Then, the smooth plate 501 and the electrode plate 504 are pressed to each other by a press so that they are intimately attached to each other over the entire area.

Figure 4B:
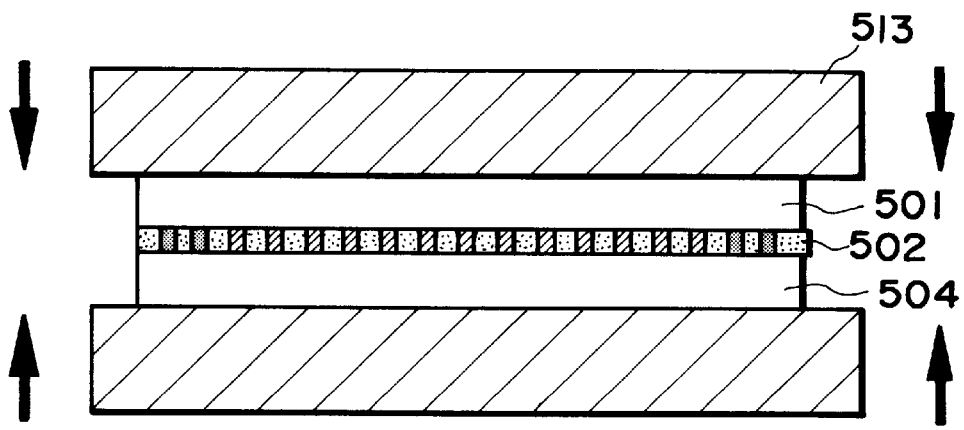
Figure 4C:
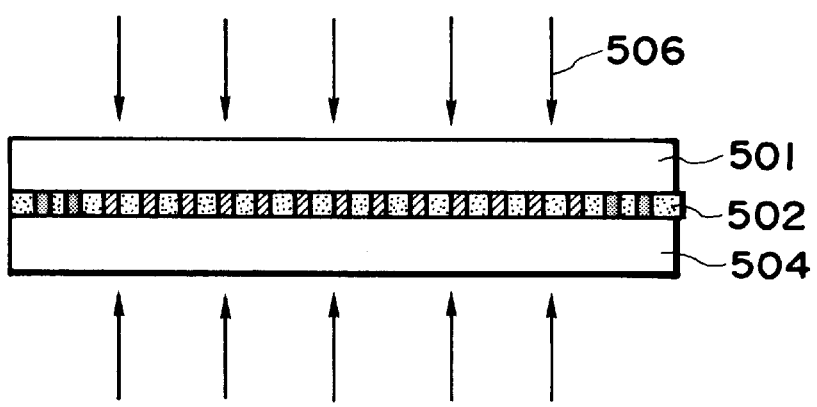
Figure 4D:
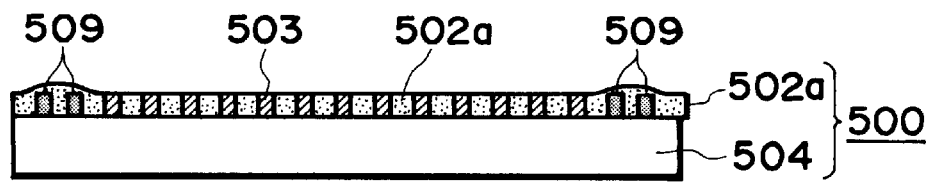

Then, the laminate is exposed to UV rays 506 to cure the UV-curable resin 502 (FIG. 4C), and the smooth plate 501 is removed therefrom to leave a circuit plate 500 wherein the gaps between the metal electrodes 503 are filled with the UV-cured resin 502a (FIG. 4D). The UV rays 506 can be applied to the UV-curable resin 502 from the smooth plate 501 side, from the electrode plate 504 side or from both sides (as shown in FIG. 4C).

The resin outside the effective optical modulation region where the smoothening of resin is intended, can be left uncured and removed later. This mode is explained with reference to FIGS. 5A–5D.

In this mode of process, the steps up to the laminate production are performed (FIGS. 5A–5B) in the same manner as explained with reference to FIGS. 4A–4B.

Figure 5A:
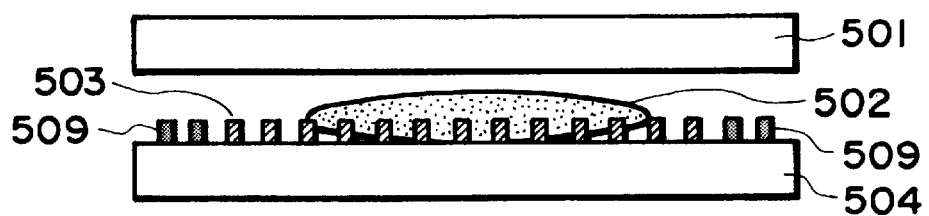
FIGS. 5A–5D and FIGS. 6A–6F are schematic sectional views for illustrating two other embodiments of the process for producing a circuit plate according to the present invention.
Figure 5B:
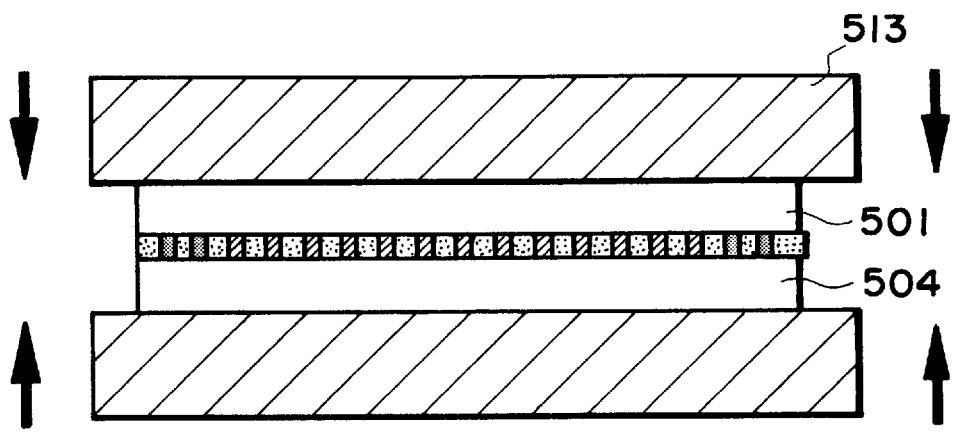
Figure 5C:
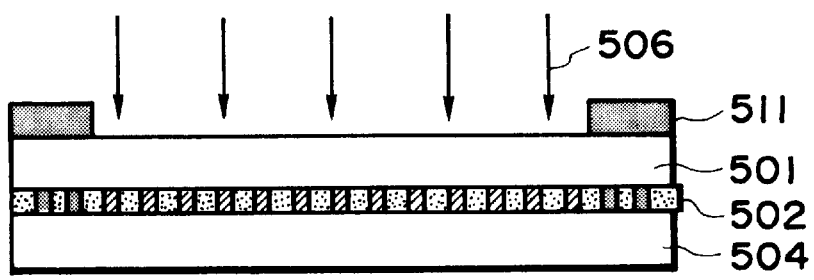
Figure 5D:
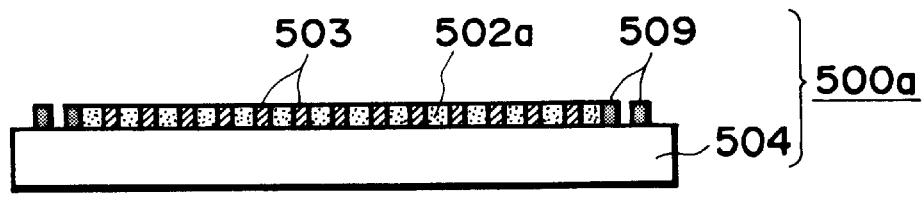

Then, the laminate of the smooth plate 501 and the electrode plate 504 are irradiated with UV rays 506 through a mask 511 for masking a peripheral region outside the effective optical modulation region (FIG. 5C), then the smooth plate 501 is released and the uncured resin at the peripheral region is removed by washing to obtain a circuit plate 500a wherein the gaps between the metal electrodes 503 in the effective optical modulation region are selectively filled with the cured region 502a while exposing the dummy conductor pieces 509 unfilled with the resin in the peripheral region (FIG. 5D). In this instance, if the silane coupling agent applied in the peripheral region is removed in advance in the step prior to FIG. 5A, the resin at the peripheral region can be removed easily by washing even if the resin is semi-cured due to leakage light passing through a mask gap.

Then, the circuit plate 500 (FIG. 4D) or 500a (FIG. 5D) may be coated with a transparent electrode film of, e.g., ITO, by sputtering etc., and the transfer electrode film may be patterned into transfer electrodes electrically connected with the respective metal electrodes, followed optionally by coating with an additional layer (such as an alignment layer in a liquid crystal device) to provide a product circuit plate.

The light-transmissive substrate 504 may have a thickness of 0.5–2.5 mm, preferably 0.6–1.5 mm, further preferably 0.7–1.2 mm. The smooth plate 501 may have a thickness of 0.5–20 mm, preferably 0.6–10 mm further preferably 0.7–4 mm. The smooth plate 501 may comprise a material identical to or different from that of the light-transmissive substrate 504.

The thus-obtained circuit plate according to the present invention having an improved surface planarity though provided with inherently uneven sub-electrodes (metal electrodes) may be advantageously incorporated in a liquid crystal device and a liquid crystal display apparatus including such a liquid crystal device, but may be generally applicable to optical modulation devices for matrix drive and display apparatus including such optical modulation devices.

Figure 16:
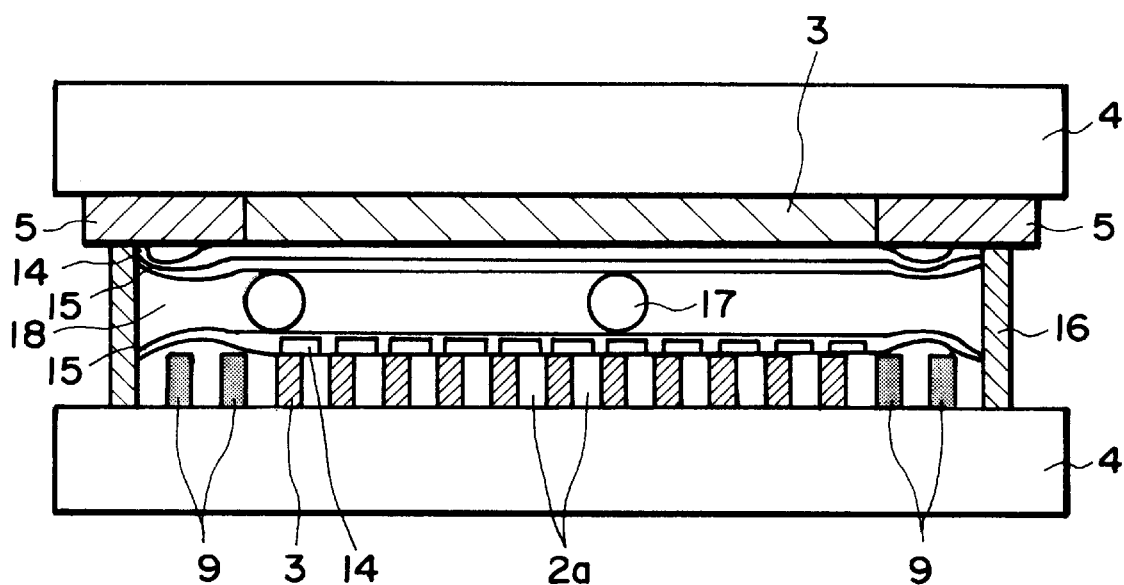
FIG. 16 is a schematic sectional view of an embodiment of the liquid crystal device according to the present invention.

An embodiment of the liquid crystal device including such a circuit plate will now be described with reference to FIG. 16. Referring to FIG. 16, the liquid crystal device includes a pair of circuit plates each including a light-transmissive substrate 4 of, e.g., glass, a plurality of stripe-shaped metal electrodes 3 formed with gaps therebetween and stripe-shaped dummy conductor pieces 9 disposed at peripheral regions outside the metal electrodes 3, lead electrodes 5 connected to the longitudinal ends of the metal electrodes 3, a cured resin 2a filling the gaps between the metal electrodes disposed on the substrate 4 so as to form a smooth surface in combination with the metal electrodes 3, stripe-shaped transfer electrodes 14 of, e.g., ITO disposed on the smooth surface so as to be each electrically connected with an associated one of the metal electrodes 3, and an alignment film 15 of, e.g., polyimide. The pair of circuit plates are disposed opposite to each other so that their stripe electrodes face each other and intersect each other so as to form an electrode matrix, and applied to each other with a sealing member 16 of, e.g., a cured epoxy resin while retaining a prescribed gap determined by spacer beads 17 disposed therebetween. Further, the gap between the circuit plates is filled with a liquid crystal 18 to form a liquid crystal device. The liquid crystal device structure thus-obtained according to the present invention may be effectively applied to a chiral smectic liquid crystal device, particularly a ferroelectric liquid crystal device, in which the delay or distortion of voltage waveform is relatively liable to be caused and the liquid crystal alignment state is liable to be affected by a surface unevenness of the circuit plates.

Hereinbelow, the present invention will be described more specifically with reference to Examples and Comparative Examples.

EXAMPLE 1

Figure 6A:
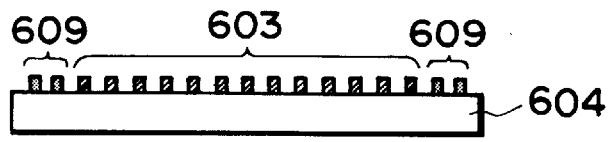

A circuit plate was prepared through a process as illustrated by FIGS. 6A–6F. First of all, on a 100 mm-square glass plate 604 of 1.1 mm in thickness, stripe metal electrodes 603 of Cr were formed each in a width of 10 $\mu$m and a thickness of 2 $\mu$m and at a pitch of 100 $\mu$m and, simultaneously on both outsides parallel to the metal electrodes 603, 100 pieces each of also stripe-shaped dummy conductor pieces 609 of Cr each in a width of 10 $\mu$m and a thickness of 2 $\mu$m were formed at a pitch of 100 $\mu$m and with a spacing of 100 $\mu$m from the metal electrodes, through a common process (FIG. 6A).

The thus-prepared electrode plate was subjected to an ozone treatment under UV irradiation for 5 min. and then to spin coating with a silane coupling agent ("A-174", mfd. by Nippon Unicar K.K.) diluted with four times of ethyl alcohol, followed by heat-treatment at 100° C. for 20 min. so as to improve the adhesion with resin.

Figure 6B:
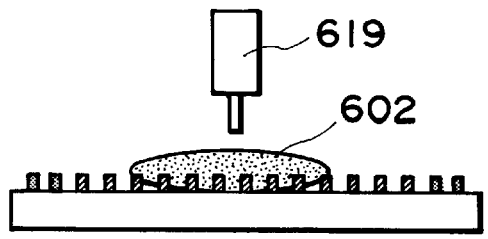
Figure 6C:
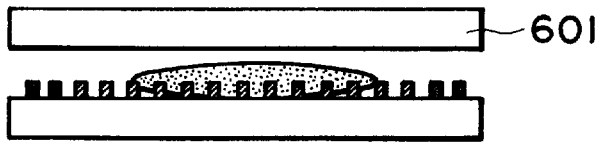

On the electrode plate 604, an acrylic UV-curable resin 602 (in the form of a monomer solution comprising a mixture of pentaerythritol triacrylate/neopentyl glycol diacrylate/1-hydroxycyclohexyl phenyl ketone (=50/50/2) was placed dropwise by using a dispenser 619 (FIG. 6B).

Figure 6D:
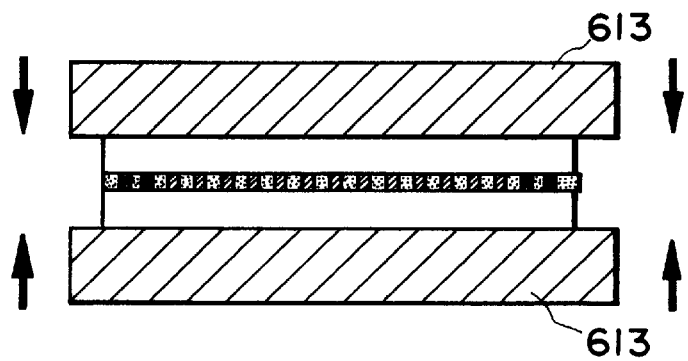

A 1.1 mm-thick glass-made smooth plate 602 was applied to contact the electrode plate 604 with the UV-curable resin 602 therebetween (FIG. 6C), and the plate 601 and the electrode plate 604 were supplied with a pressure of 20 k/cm$^2$ for 3 min. by a press 613 (FIG. 6D).

Figure 6E:
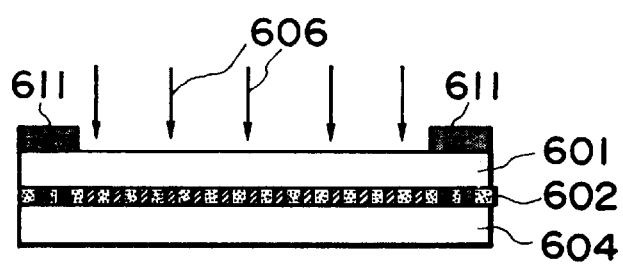

The laminate of the smooth plate 601 and the electrode plate 604, after taking out from the press 613, was irradiated with UV rays 606 having a central wavelength of 365 nm at an intensity of 200 mJ/cm$^2$ to cure the UV-curable resin 602 while masking a peripheral region outside the effective optical modulation region (display region) with a mask 611 (FIG. 6E).

Figure 6F:
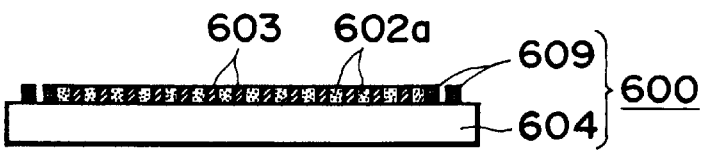

Then, the smooth plate 601 was removed from the electrode plate 604 by using a releasing tool (not shown), and the resultant electrode plate 604 was subjected to ultrasonic washing within isopropanol to remove the uncured UV-curable resin at the peripheral region to obtain a circuit plate 600 wherein the gaps between the metal electrodes 603 are filled with the cured resin 602a as shown in FIG. 6F.

Two sheets of the circuit plate 600 thus prepared were respectively further provided with 95 μm-wide ITO stripe electrodes connected to associated metal electrodes through sputtering and patterning, and coated with a rubbed polyimide alignment film, and applied opposite to each other so that their rubbing directions are parallel and opposite to each other while leaving a gap of 1.5 μm, which was then filled with a ferroelectric liquid crystal to obtain a liquid crystal device. The thus-obtained liquid crystal device was found to have a uniform cell gap over the entirety of the effective optical modulation region and thus free from voltage waveform distortion due to sinal delay.

EXAMPLE 2

A circuit plate was prepared in the same manner a in Example 1 except the metal electrodes 603 were elongated in the same width of 10 μm by 8 mm each into peripheral regions outside the effective optical modulation region to form a part of the lead electrodes 605 originally having a width of ca. 75 μm.

The circuit plate showed a better observability of alignment marks at the peripheral region and allowed easier patterning to ITO films on the metal electrodes and alignment with a counter circuit plate prepared in a similar manner.

Two sheets of the thus-obtained circuit plate were used to form a liquid crystal device otherwise similarly as in Example 1, whereby the resultant liquid crystal device showed a uniform cell gap over the entire area of the effective optical modulation region. Further, when the liquid crystal device was connected with peripheral drive ICs via the lead electrodes, the conduction failure occurrence rate was 0.5% in terms of the percentage of number of metal electrodes showing a connection resistance of 100 ohm. or higher per total number of metal electrodes.

COMPARATIVE EXAMPLE

Figure 7A:
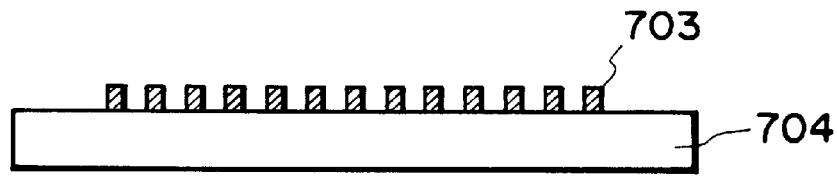
FIG. 7A is a schematic sectional view of an electrode plate used in a comparative process for producing a circuit plate.
Figure 7B:
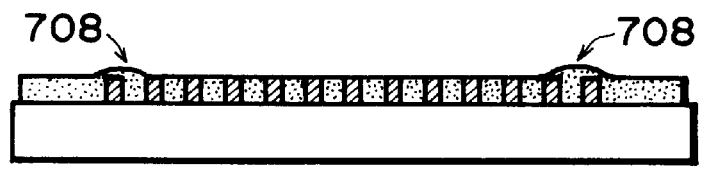
FIG. 7B is a schematic sectional view of a circuit plate produced thereby.

A circuit plate was prepared through a process as illustrated in FIGS. 7A and 7B. More specifically, on a 100 μm-square glass plate 704, stripe metal electrodes 703 of Cr were formed each in a width of 10 μm and a thickness of 2 μm and at a pitch of 100 μm similarly as in Example 1 but without forming dummy conductor piece in the peripheral region to form an electrode plate (FIG. 7A). The electrode plate was subjected to application of silane coupling agent and so on similarly as in Example 1 except for using no mask during the UV irradiation to prepare a circuit plate as shown in FIG. 7B.

Two sheets of the thus-prepared circuit plate were used otherwise similarly as in Example 1 to prepare a liquid crystal device with a cell gap of 1.5 μm, whereby the resultant liquid crystal device showed a yellowish tint in a width of ca. 5 mm along a periphery of but within the effective optical modulation region due to a smaller cell gap caused by a resin swelling portion 708 as shown in FIG. 7B on the circuit plate. Further, the liquid crystal device caused a conduction failure at a rate of 8% during connection with peripheral ICs.

EXAMPLE 3

On a 100 mm-square glass plate, stripe metal electrodes of Cr were formed each in a width of 10 μm and a thickness of 2 μm and at a pitch of 100 μm and, simultaneously on both outsides parallel to the metal electrodes, 20 pieces each of also stripe-shaped dummy conductor pieces of Cr each in a width of 15 μm and a thickness of 2 μm were formed at a pitch of 300 μm with a spacing of 500 μm from the metal electrodes, through a common process, to prepare an electrode plate.

The electrode plate was subjected to application of silane coupling agent and so on similarly as in Example 1 to prepare a circuit plate, and two sheets of the circuit plate were used otherwise similarly as in Example 1 to prepare a liquid crystal device with a cell gap of 1.5 μm. The resultant liquid crystal device showed a uniform cell gap over the entire area of the effective optical modulation region and was free from voltage waveform distortion.

EXAMPLE 4

On a 100 mm-square glass plate, stripe metal electrodes of Cr were formed each in a width of 10 μm and a thickness of 2 μm and at a pitch of 100 μm and, simultaneously on both outsides parallel to the metal electrodes, 20 pieces each of also stripe-shaped dummy conductor pieces of Cr each in a width of 15 μm and a thickness of 2 μm were formed at a pitch of 300 μm with a spacing of 500 μm from the metal electrodes, through a common process. Further, the metal electrodes were elongated in the same width by 10 mm into peripheral regions outside the effective optical modulation region to form a narrower part of the lead electrodes, thereby providing an electrode plate.

The electrode plate was subjected to an ozone treatment under UV irradiation for 5 min. and then to spin coating with a silane coupling agent ("A-174", mfd. by Nippon Unicar K.K.) diluted with ten times of isopropyl alcohol, followed by removal by wiping of the silane coupling agent from the peripheral region outside the effective optical modulation region and heat-treatment at 100° C. for 20 min. so as to improve the adhesion with the resin in the effective optical modulation region.

Then, the electrode plate was subjected to application of a UV-curable resin and so on similarly as in Example 1 to prepare a circuit plate, and two sheets of the circuit plate were used otherwise similarly as in Example 1 to prepare a liquid crystal device with a cell gap of 1.5 μm. The resultant liquid crystal device showed a uniform cell gap over the entire area of the effective optical modulation region and was free from voltage waveform distortion. When the liquid crystal device was connected with peripheral drive ICs, the conduction failure occurrence rate was 0%.

EXAMPLE 5

Figure 8:
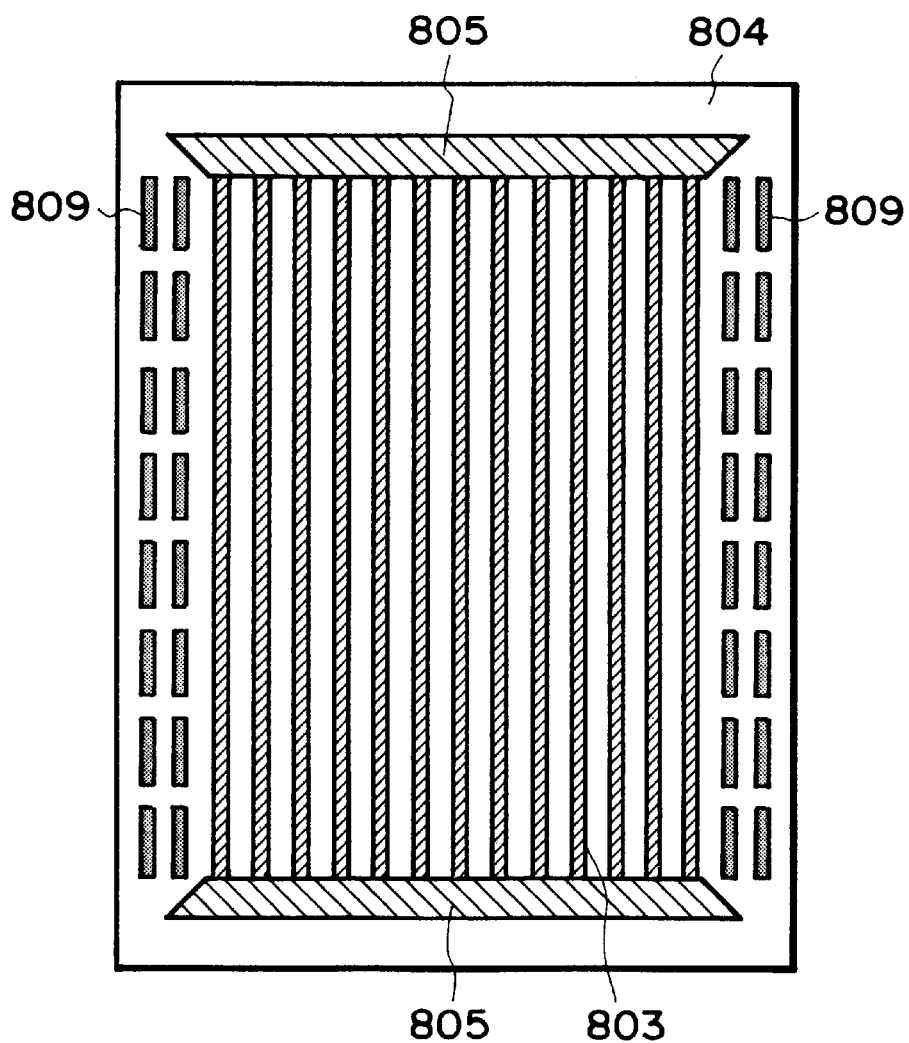
FIG. 8 is a schematic plan view of another example of electrode plate used in a process for producing a circuit plate according to the present invention.
Figure 9A:
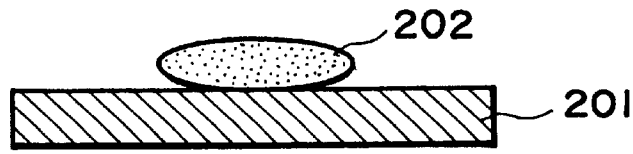
FIGS. 9A–9D and 10A–10D are schematic sectional views for illustrating a series of steps generally involved in a process for producing a circuit plate.
Figure 9B:
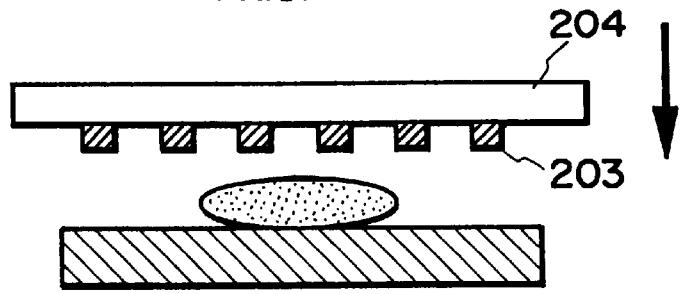
Figure 9C:
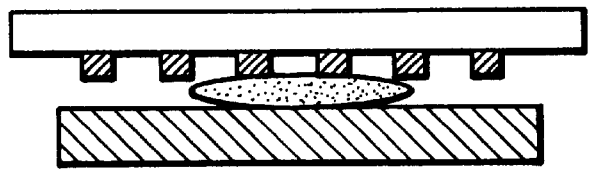
Figure 9D:
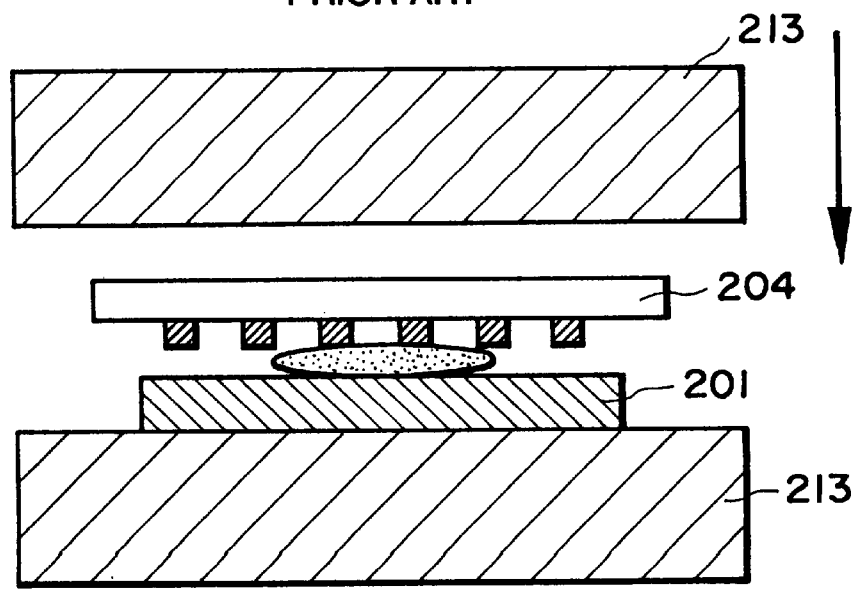
Figure 10A:
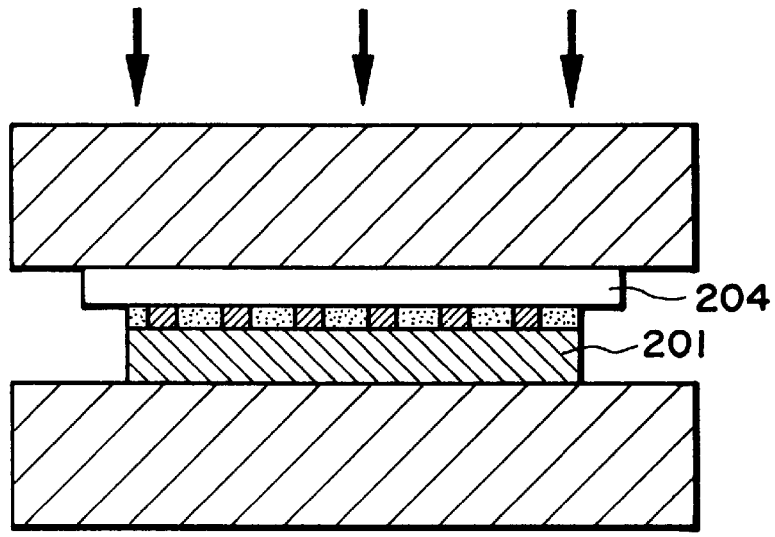
Figure 10B:
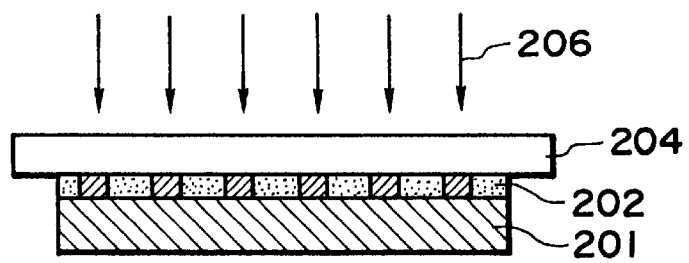
Figure 10C:
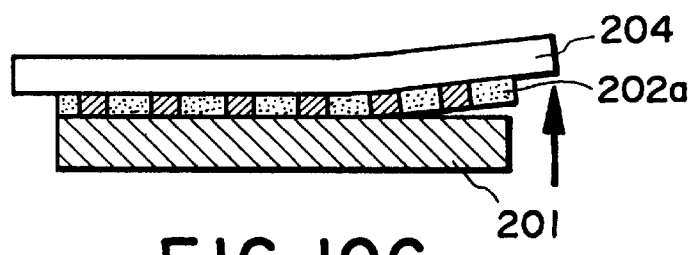
Figure 10D:
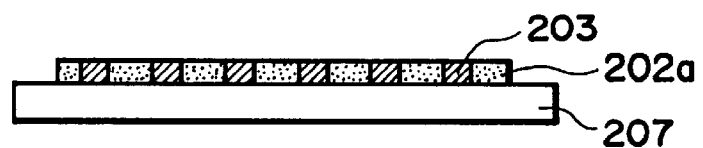
Figure 11A:
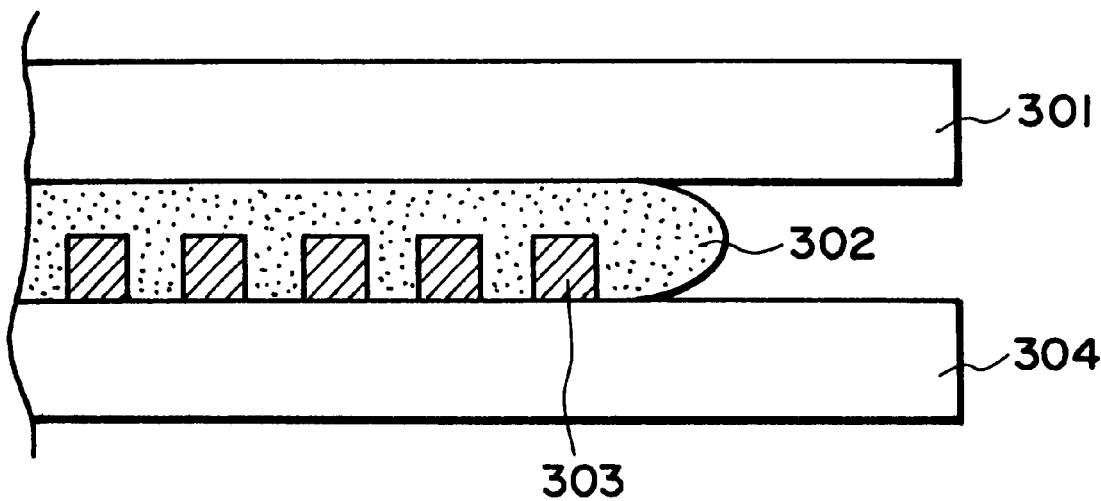
FIGS. 11A and 11B are schematic sectional views for illustrating a problem involved in a prior art process for producing a circuit plate.
Figure 11B:
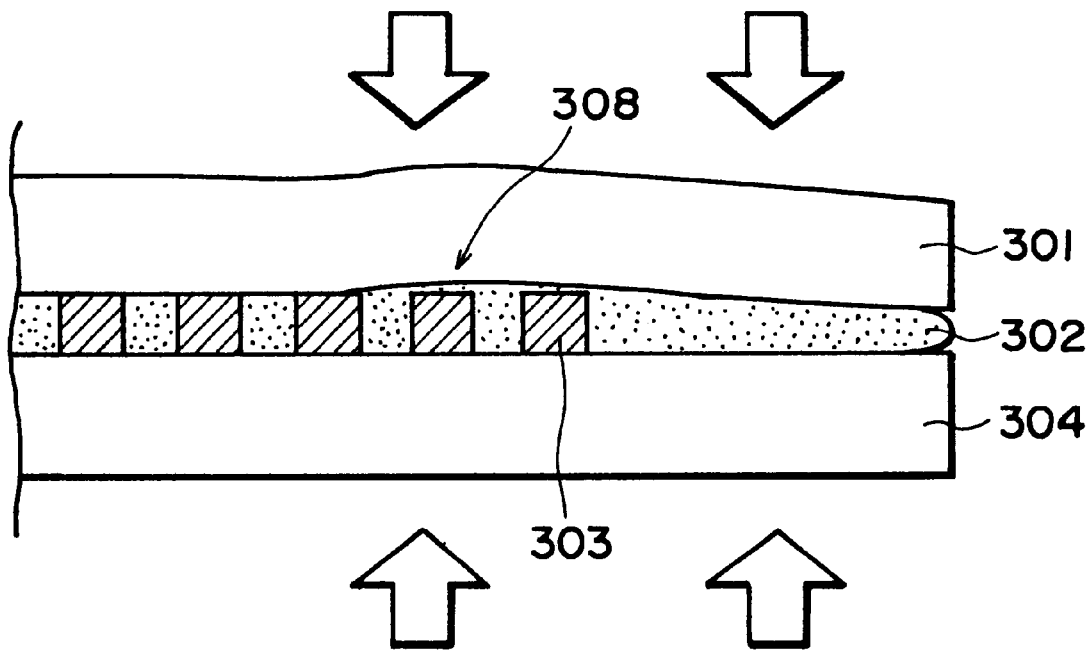
Figure 12A:
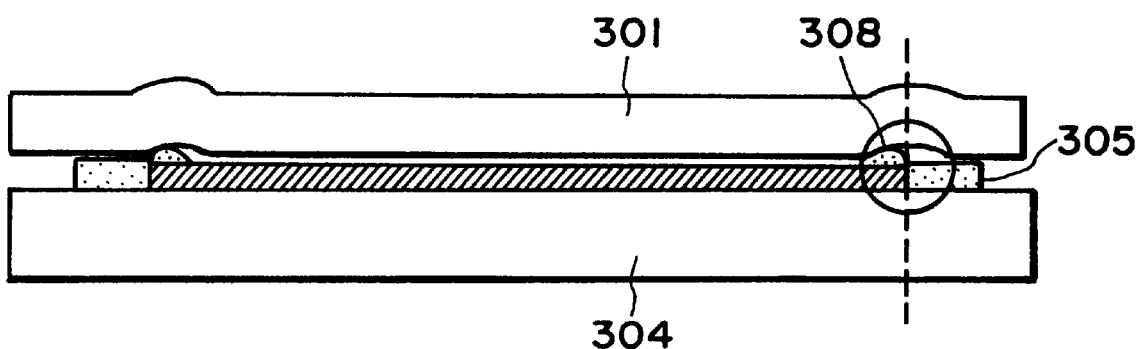
FIGS. 12A and 12B are a schematic sectional view and an enlarged partial plan view, respectively, for illustrating a swelling of resin in proximity to lead electrodes.
Figure 12B:
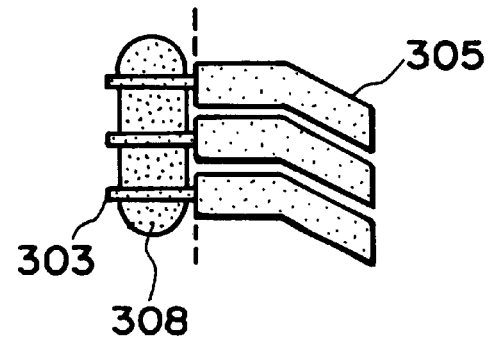

As shown in FIG. 8, on a 100 mm-square glass plate 804, stripe metal electrodes 803 of Mo were formed each in a width of 10 μm and a thickness of 2 μm and at a pitch of 100 μm and, simultaneously on both outsides parallel to the metal electrodes, 16 island-shaped (or discrete rectangular) dummy conductor pieces 809 of Mo each in a width of 200 μm, a length of 10 mm and a thickness of 2 μm were formed in two rows each including 8 pieces with a spacing of 300 μm therebetween and with a spacing of 300 μm from the metal electrodes 803 through a common process to prepare an electrode plate.

The electrode plate was subjected to application of silane coupling agent and so on similarly as in Example 1 to prepare a circuit plate, and two sheets of the circuit plate were used otherwise similarly as in Example 1 to prepare a liquid crystal device with a cell gap of 2.1 μm. The resultant liquid crystal device showed a uniform cell gap over the entire area of the effective optical modulation region and was free from voltage waveform distortion.

EXAMPLE 6

A circuit plate was prepared in the same manner as in Example 5 except the metal electrodes 803 were elongated in the same width by 5 mm each into peripheral regions outside the effective optical modulation region to form a narrower part of the lead electrodes 805.

Two sheets of the thus-obtained circuit plate were used to form a liquid crystal device with a cell gap of 2.1 μm otherwise similarly as in Example 1, whereby the resultant liquid crystal device showed a uniform cell over the entire area of the effective optical modulation region and was free from voltage waveform distortion. Further, when the liquid crystal device was connected with peripheral drive ICs via the lead electrodes, the conduction failure occurrence rate was 0%.

EXAMPLE 7

On a 100 mm-square glass plate, stripe metal electrodes of Cr were formed each in a width of 10 μm and a thickness of 2 μm and at a pitch of 100 μm. Then, on both outsides parallel to the metal electrodes, 10 pieces each of also stripe-shaped dummy projection pieces of a photoresist each in a width of 20 μm and a thickness of 1 μm were formed at a pitch of 300 μm with a spacing of 500 μm from the metal electrodes, to prepare an electrode plate.

The electrode plate was subjected to application of silane coupling agent and so on similarly as in Example 1 to prepare a circuit plate, and two sheets of the circuit plate were used otherwise similarly as in Example 1 to prepare a liquid crystal device with a cell gap of 2.1 μm. The resultant liquid crystal device showed a uniform cell gap over the entire area of the effective optical modulation region and was free from voltage waveform distortion.

EXAMPLE 8

A circuit plate was prepared in the same manner as in Example 7 except the metal electrodes were elongated in the same width by 15 mm each into peripheral regions outside the effective optical modulation region to form a narrower part of the lead electrodes, to form an electrode plates.

The electrode plate was subjected to application of silane coupling agent and so on similarly as in Example 1 to prepare a circuit plate, and two sheets of the circuit plate were used otherwise similarly as in Example 1 to prepare a liquid crystal device with a cell gap of 2.1 μm. The resultant liquid crystal device showed a uniform cell gap over the entire area of the effective optical modulation region and was free from voltage waveform distortion. Further, when the liquid crystal device was connected with peripheral ICs via the lead electrodes, the conduction failure occurrence rate was 0%.

EXAMPLE 9

On a 100 mm-square glass plate, stripe metal electrodes of Cr were formed each in a width of 10 μm and a thickness of 4 μm and at a pitch of 100 μm. Then, on both outsides parallel to the metal electrodes and with a spacing of 1 mm apart from the metal electrodes, three island-shaped (or discrete rectangular) dummy conductor pieces of Au foil each having a width of 4 mm, a length of 20 mm and a thickness of 4.3 μm were disposed with a spacing of 10 mm therebetween in a single row parallel to the metal electrodes by transfer, to form an electrode plate.

The electrode plate was subjected to application of silane coupling agent and so on similarly as in Example 1 to prepare a circuit plate, and two sheets of the circuit plate were used otherwise similarly as in Example 1 to prepare a liquid crystal device with a cell gap of 2.1 μm. The resultant liquid crystal device showed a uniform cell gap over the entire area of the effective optical modulation region and was free from voltage waveform distortion.

EXAMPLE 10

An electrode plate was prepared in the same manner as in Example 9 except the metal electrodes were elongated in the same width by 10 mm each into peripheral regions outside the effective optical modulation region to form a narrower part of the lead electrodes.

The electrode plate was subjected to application of silane coupling agent and so on similarly as in Example 1 to prepare a circuit plate, and two sheets of the circuit plate were used otherwise similarly as in Example 1 to prepare a liquid crystal device with a cell gap of 2.1 μm. The resultant liquid crystal device showed a uniform cell gap over the entire area of the effective optical modulation region and was free from voltage waveform distortion. Further, when the liquid crystal device was connected with peripheral ICs via the lead electrodes, the conduction failure occurrence rate was 0%.

As described above, according to the present invention, a circuit plate can be provided with a uniformly flat surface in the effective optical modulation region when gaps between the metal electrodes are filled with a resin. By using such circuit plates, particularly preferably in a liquid crystal device, it is possible to provide the liquid crystal device with a uniform cell gap leading to high-quality images in a liquid crystal display apparatus.

Further, it becomes possible to avoid coverage of the lead electrodes with a resin, thus ensuring good electrical connection with peripheral ICs and good alignment mark recognizability leading to an accurate mask alignment.

What is claimed is:

1. A circuit plate, comprising: a light-transmissive substrate, and a plurality of first electrodes and second electrodes supported on the light-transmissive substrate; wherein each second electrode is disposed between an associated first electrode and the light-transmissive substrate so as to be electrically connected with the associated first electrode, said plurality of second electrodes are disposed in a region in the light-transmissive substrate with gaps therebetween which are filled with an insulating layer, the second electrodes and the insulating layer in combination forming a surface on which the first electrodes are formed, and a plurality of projection pieces are disposed in a region on the light-transmissive substrate outside the region of the second electrodes so as to be free from connection with the first electrodes and the second electrodes, said projection pieces having a height substantially identical to that of the second electrodes.

2. A circuit plate according to claim 1, wherein said light-transmissive substrate comprises glass.

3. A circuit plate according to claim 1, wherein the second electrodes and the projection pieces are formed of an identical metal species.

4. A circuit plate according to claim 1, wherein the second electrodes and the projection pieces are formed in a common step.

5. A circuit plate according to claim 1, wherein the projection pieces are disposed with gaps therebetween which are not filled with the insulating layer.

6. A circuit plate according to claim 1, wherein the projection pieces are each formed in an elongated shape parallel to a longitudinal direction of the second electrodes.

7. A circuit plate according to claim 1, wherein the projection pieces are formed in a peripheral region on the light-transmissive substrate extending parallel to the longitudinal direction of and outside the second electrodes.

8. A circuit plate according to claim 1, wherein said plurality of projection pieces are each formed in a discrete island shape.

9. A circuit plate according to claim 1, wherein said plurality of projection pieces are formed in an elongated peripheral region having a width of 1–20 $\mu$m extending parallel to the longitudinal direction of and outside the second electrodes.

10. A circuit plate according to claim 1, wherein each second electrode has a longitudinal end which is electrically connected with a lead electrode for connection with an external member, said lead electrode comprising a narrower width portion adjacent to the second electrode and a wider width portion for connection with the external member.

11. A circuit plate according to claim 10, wherein said narrower width portion of the lead electrode has a length of 1–20 mm.

12. A circuit plate according to claim 1, wherein said insulating layer comprises an ultra violet-cured resin.

13. A circuit plate according to claim 1, wherein said first electrode is a transparent electrode.

14. A process for producing a circuit plate comprising a light-transmissive substrate, and a plurality of first electrodes and second electrodes supported on the light-transmissive substrate, each second electrode being disposed between an associated first electrode and the light-transmissive substrate so as to be electrically connected with the associated first electrode, said process comprising the steps of:

forming a plurality of second electrodes with gaps therebetween on a region of a light-transmissive substrate, forming a plurality of projection pieces in a region outside the region of the second electrodes on the light-transmissive substrate so as not to be electrically connected with the second electrodes, wherein the projection pieces have a height substantially identical to that of the second electrodes, forming an insulating layer so as to fill the gaps between the second electrodes and form a surface together with the second electrodes, and forming first electrodes on said surface so that each first electrode is electrically connected with an associated second electrode.

15. A process according to claim 14, wherein the second electrodes and the projection pieces are formed in a common step.

16. A liquid crystal device, comprising: a pair of circuit plates disposed opposite to each other, and a liquid crystal disposed between the circuit plates; at least one of said pair of circuit plates comprising:

a light-transmissive substrate, a plurality of first electrodes and second electrodes supported on the light-transmissive substrate, each second electrode being disposed between an associated first electrode and the light-transmissive substrate so as to be electrically connected with the associated first electrode, the plurality of second electrodes being formed with gaps therebetween on a region of the light-transmissive substrate, an insulating layer disposed to fill the gaps between the second electrodes, and a plurality of projection pieces formed in a region outside the region of the second electrodes so as to be spaced apart from the second electrodes, said projection pieces having a height substantially identical to that of the second electrodes.

17. A liquid crystal device according to claim 16, wherein the second electrodes and the projection pieces are formed of an identical metal species.

18. A liquid crystal device according to claim 16, wherein the second electrodes and the projection pieces are formed in a common step.

19. A liquid crystal device according to claim 16, wherein the projection pieces are disposed with gaps therebetween which are not filled with the insulating layer.

20. A liquid crystal device according to claim 16, wherein the projection pieces are each formed in an elongated shape parallel to a longitudinal direction of the second electrodes.

21. A liquid crystal device according to claim 16, wherein the projection pieces are formed in a peripheral region on the light-transmissive substrate extending parallel to the longitudinal direction of and outside the second electrodes.

22. A liquid crystal device according to claim 16, wherein said plurality of projection pieces are each formed in a discrete island shape.

23. A liquid crystal device according to claim 16, wherein said plurality of projection pieces are formed in an elongated peripheral region having a width of 1–20 $\mu$m extending parallel to the longitudinal direction of and outside the second electrodes.

24. A liquid crystal device according to claim 16, wherein each second electrode has a longitudinal end which is electrically connected with a lead electrode for connection with an external member, said lead electrode comprising a narrower width portion adjacent to the second electrode and a wider width portion for connection with the external member.

25. A liquid crystal device according to claim 24, wherein said narrower width portion of the lead electrode has a length of 1–20 mm.

26. A liquid crystal device according to claim 16, wherein said light-transmissive substrate comprises glass.

27. A liquid crystal device according to claim 16, wherein said insulating layer comprises an ultra violet-cured resin.

28. A liquid crystal device according to claim 16, wherein said first electrode is a transparent electrode.

29. A liquid crystal device according to claim 16, wherein said liquid crystal is a chiral smectic liquid crystal.

30. A liquid crystal device according to claim 16, wherein said liquid crystal is a ferroelectric liquid crystal.

31. A process for producing a liquid crystal device comprising the steps of:

forming a plurality of second electrodes with gaps therebetween on a region of a light-transmissive substrate, forming a plurality of projection pieces in a region outside the region of the second electrodes on the light-transmissive substrate so as not to be electrically connected with the second electrodes, said projection pieces having a height substantially identical to that of the second electrodes, forming an insulating layer so as to fill the gaps between the second electrodes and form a surface together with the second electrodes, preparing a circuit plate comprising forming first electrodes on said surface so that each first electrode is electrically connected with an associated second electrode, disposing a pair of the circuit plates opposite to each other while leaving a gap therebetween, and filling the gap with a liquid crystal.

32. A process according to claim 31, wherein the second electrodes and the projection pieces are formed in a common step.

* * * * *